June 1, 1965 R. N. MERINGTON 3,187,267
AMPLIFIER INCLUDING REFERENCE LEVEL DRIFT
COMPENSATION FEEDBACK MEANS
Filed July 24, 1961
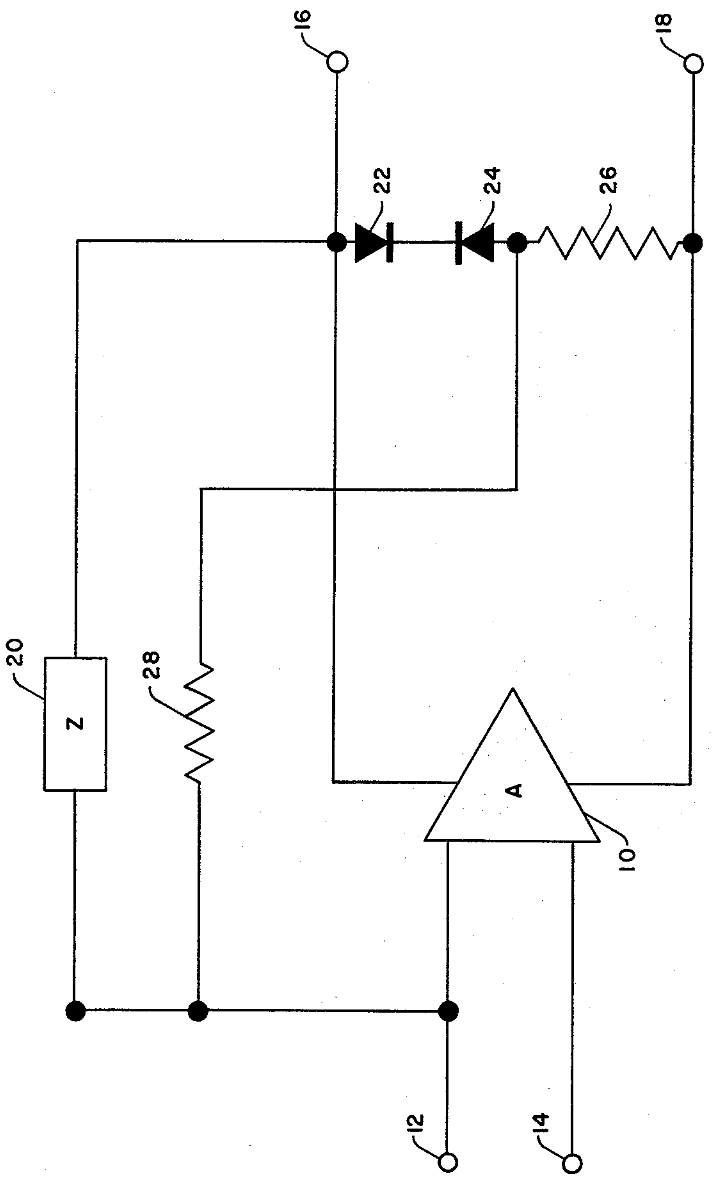
RICHARD N. MERINGTON
*INVENTOR.*
BY William L. Jones
ATTORNEY 3,187,267
Patented June 1, 1965

3,187,267

AMPLIFIER INCLUDING REFERENCE LEVEL DRIFT COMPENSATION FEEDBACK MEANS

Richard N. Merington, Irving, Tex., assignor, by mesne assignments, to Ling-Temco-Vought, Inc., Dallas, Tex., a corporation of Delaware Filed July 24, 1961, Ser. No. 126,146
1 Claim. (Cl. 330—110)

This invention relates generally to the stabilization of amplifiers and, more particularly, to circuits useful in reducing or preventing the drifting tendencies of certain amplifiers, such as D.-C. amplifiers.

While the invention is of general application, it provides particular advantages when applied to D.-C. amplifiers wherein the signals are of the constant-amplitude type. Also, the invention may be applied to particular advantage in connection with D.-C. amplifiers having feedback arrangements, such as are commonly employed as integrators in computers and other types of equipment. As one example, the invention may be applied to drift-stabilize integrators used to provide constant amplitude but phase-shifted signals for comparison with other signals. See the co-pending United States patent application Serial No. 118,037, entitled "Control System Testing," which was filed on June 19, 1961, jointly by Billy C. Hooker and the inventor herein.

One object of the present invention is to provide improvide circuitry useful in reducing or preventing the drifting tendency of amplifiers of the type described.

The foregoing and additional objects are attained by the invention, which involves the concept of utilizing Zener diodes to develop drift control signals which change in accordance with changes occurring in the zero or base reference point of the circuit to be controlled. Thus, drift control signals for use in stabilizing a D.-C. amplifier may be obtained from Zener diodes coupled so as to develop voltages which change when the zero or base reference point of the amplifier output circuit changes. These drift control signals are supplied as feedback to the amplifier input circuit. However, where the amplifier is of the D.-C. type with an impedance feedback circuit, such as in an integrator arrangement, the drift control signals are in addition to any feedback signals ordinarily supplied to the input circuit.

It is believed that the foregoing features, and additional objects and advantages, will be more apparent from the following description when read in connection with the accompanying drawing wherein the single figure is a diagrammatic representation, partly in block-diagram form, of an integrator circuit having the invention incorporated therein.

Referring to the drawing in detail, a D.-C. amplifier 10 is there shown provided with signal input terminals 12 and 14 and with signal output terminals 16 and 18. A feedback impedance 20, which may be a capacitor or several capacitors arranged with switching means to permit selection of the value of feedback capacitance to be included, is shown connected between the output terminal 16 and the input terminal 12. As described to this point, the circuitry is a standard or conventional integrator arrangement.

In accordance with the present invention, Zener diodes 22 and 24 are coupled to the output circuit of the amplifier 10 so as to develop drift control signals which are supplied as additional feedback voltage to the amplifier input circuit. In the arrangement shown, the diode 22 is connected between the output terminal 16 and the diode 24, which in turn is connected through a resistor 26 to the other output terminal 18. A resistor 28 is shown connected between the amplifier input terminal 12 and a point between the resistor 26 and the diodes 22 and 24. The arrangement is such that the diodes 22 and 24 and the resistor 26 extend in series across the output terminals 16 and 18 of the amplifier 10. Any drift control signals developed due to current flow through the resistor 26 are supplied through resistor 28 to the input circuit of the amplifier 10.

It will be noted that the diodes 22 and 24 are connected in opposing relation to each other. For example, diode 22 is shown connected so as to provide a high impedance path for electrons attempting to pass therethrough in a direction from the output terminal 18 toward the output terminal 16, such as where the output signal voltage at terminal 16 is positive with respect to the voltage at terminal 18. On the other hand, diode 24 is shown connected so as to provide a high impedance path for electrons attempting to pass therethrough in the opposite direction, such as where the output signal voltage at terminal 16 is negative with respect to the voltage at terminal 18.

Stated differently, when the voltage at terminal 16 is negative with respect to the voltage at terminal 18, the diode 22 conducts current readily, while the diode 24 conducts current only when the voltage applied is greater than its Zener breakdown value. On the other hand, when the voltage at terminal 16 is positive with respect to the voltage at terminal 18, the diode 24 conducts current readily, while the diode 22 conducts current only when the voltage applied is greater than its Zener breakdown value.

It is preferred that the diodes 22 and 24 have Zener breakdown values which are sufficiently low to permit some current to flow through the resistor 26 during each positive and negative peak portion of the sine wave output signal. That is, it is preferred that the Zener breakdown value of diode 22 be exceeded momentarily during each positive half-cycle and that the Zener breakdown value of diode 24 be exceeded momentarily during each negative half-cycle.

While it is true that the small amount of current which is permitted to flow through resistor 26 each time the output signal approaches its positive or negative peak value will result in the development of some feedback voltage, it has been found that this arrangement is not necessarily objectionable, so long as the voltage thus developed is relatively small.

In this connection, it is pointed out that the value of the resistor 28 is preferably sufficiently high so that there is a relatively long time constant, such as due to the resistor 28 and the impedance 20, which causes each value of feedback voltage developed across resistor 26 to be applied to the input circuit at a reduced value over a period of time which is relatively long in relation to the length of the period during which each peak portion of the output signal exceeds the Zener breakdown voltage of one of the diodes 22 or 24.

Particularly where the circuitry is employed to provide test signals which are compared with other signals mainly as to their phase relationships, it has been found that relatively small distortions in shape and amplitude, such as might be due to the aforesaid relatively small feedback voltage being regularly present, do not result in appreciable errors. In fact, a relatively high degree of accuracy is obtainable in making phase comparisons even if the sine wave signals are only straight line approximations of pure sine waves.

The operation of the invention will be described with particular reference to its application in control system testing apparatus which includes an integrator circuit having a D.-C. amplifier with impedance feedback. For example, the invention may be applied to the second integrator circuit shown employed in the apparatus of the aforesaid co-pending United States patent application Serial No. 118,037, entitled "Control System Testing."

As stated in said co-pending application, the main purpose of the second integrator there employed is to shift the phase of its sine wave input signal by 90 degrees. The signal passing through the integrator may be changed or varied in frequency, such as by adjusting the frequency range or vernier frequency setting of the testing apparatus. The signals are each of the constant-amplitude type, so that it would be expected that there would be no amplitude variation between successive cycles with respect to zero or a base reference point, assuming that there is no drifting tendency. However, in the absence of suitable amplifier stabilization, experience has shown that some drifting will occur and this will be noticeable in the amplifier output circuit, where the zero or base reference point will shift. As a result, there will be a tendency for the sine wave output signal to have certain cycles which are not of uniform positive and negative variation. For example, a given cycle may during its positive half-cycle reach a maximum value which exceeds by a fraction of a volt, or even more, the maximum negative value which it reaches during the succeeding or preceding negative half-cycle.

Where the present invention is employed, if the zero or base reference point of the sine wave output signal of the amplifier 10 shifts upwardly or downwardly, such as due to drifting, the feedback voltage developed across the resistor 26 will change in value. More specifically, if at the beginning of a given cycle of the sine wave output signal there is a variance in the zero or base reference point in comparison with that existing at the beginning of the preceding cycle, a different amount or value of feedback voltage will be developed across the resistor 26 when one or the other of the Zener diodes 22 and 24 conducts during the half-cycle which immediately follows the shifting of the reference point.

For example, a more negative reference point results either in a decrease in the positive feedback voltage or in an increase in the negative feedback voltage which is developed across resistor 26 during the ensuing half-cycle, depending on whether the change in reference point occurs at the beginning of a positive half-cycle or at the beginning of a negative half-cycle of operation.

On the other hand, a more positive reference point results either in an increase in the positive feedback voltage or in a decrease in the negative feedback voltage, depending on where the change in reference point occurs.

Since there is a phase shift of 90 degrees in the integrator circuit, it will be noted that the drift control signal (in the form of a changed value of feedback voltage across resistor 26) is applied to the input circuit so as to change its zero or reference point during that half-cycle of the input signal which commences when the output signal is at or near a peak or maximum value. For example, in the integrator involved, the phase of the output signal may be considered 90 degrees ahead or 270 degrees behind that of the input signal, so that the drift control signal developed during the positive half-cycle of the outut signal is applied to the input circuit during a negative half-cycle of the input signal. Similarly, in such an arrangement, the drift control signal developed during the negative half-cycle of the output signal is applied to the input circuit during a positive half-cycle of the input signal.

Accordingly, it will be noted that the drift control signal, whether developed during a positive or during a negative half-cycle of the output signal, is applied to the input circuit in such manner that it increases the maximum value or "swing" (positive or negative, as the case may be) of the ensuing half-cycle of the input signal. This results in increasing the maximum value or "swing" of the particular output half-cycle which corresponds thereto. Since there is a phase shift of 90 degrees between the input and output signals, an increase in the maximum value or "swing" of a particular half-cycle of the input signal which is, for example, positive is accompanied by an increase in the maximum value or "swing" of an opposite or negative half-cycle of the output signal. Likewise, an increase in the maximum value or "swing" of a negative half-cycle of the input signal is accompanied by an increase in the maximum value or "swing" of a positive half-cycle of the output signal.

As a result, the half-cycle of the output signal which follows or occurs immediately subsequent to the development of a particular drift control signal is influenced by that signal in a manner such that its zero or base reference point tends to shift in the opposite direction, thus tending to stabilize the amplifier by making correction for the previous deviation.

In this connection, it will be noted that where the signal passing through the amplifier 10 is of the constant-amplitude type, any change in the zero or base reference point which causes an increase in the maximum value or "swing" of one half-cycle will itself tend to cause a decrease in the maximum value or "swing" of the other half-cycle of the same wave. This tendency is in effect opposite to the influence exerted by the drift control signal of the present invention, which thus tends to increase the value of an otherwise reduced voltage as distinct from merely increasing the value of an otherwise normal voltage to offset a previous deviation. Accordingly, there is less likelihood of "hunting" or "overshooting" using the arrangement of the present invention.

At the same time, it will be noted that the value of the drift control signal (that is, the amount of change in value of the feedback voltage developed across resistor 26) is determined by the amount of shift which occurs in the zero or base reference point, rather than merely by the peak-to-peak or other value representative of the amplitude of the output signal. This is quite different from feedback arrangements of the type wherein a feedback signal proportional to the value of an output signal is employed.

While the invention has been described herein with particular reference to certain applications thereof, it is understood that these are by way of example and not by way of limiting the scope of the invention, which is best defined with reference to the appended claim.

I claim:

In a D.-C. amplifier having an input circuit and an output circuit wherein the signals ordinarily passing through said amplifier are constant-amplitude sine wave signals, the combination comprising means connected to said output circuit for sampling the amount of reference level drift at the peak portions of either half cycle of the signals appearing on said output circuit, means connected in series relationship with said sampling means for establishing a regenerative feedback signal having a value indicative of the value of said peak portion, and means connected to said last-named means for supplying said feedback signal to said input circuit 90 degrees out of phase with the signals appearing on the input circuit whereby the sampled value is applied in phase with the next half cycle of opposite polarity.

References Cited by the Examiner

UNITED STATES PATENTS

| | | | |
|---|---|---|---|
| 2,949,233 | 8/60 | Fogarty | 330—103 X |
| 3,034,068 | 5/62 | Hansen | 330—110 X |
| 3,058,068 | 10/63 | Hinrichs et al. | |

ROY LAKE, *Primary Examiner.*

ARTHUR GAUSS, *Examiner.*